(12) United States Patent
Hashimoto et al.

(10) Patent No.: US 6,562,716 B2
(45) Date of Patent: May 13, 2003

(54) METHOD FOR FABRICATING SEMICONDUCTOR DEVICE

(75) Inventors: Shin Hashimoto, Osaka (JP); Kyoko Egashira, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 101 days.

(21) Appl. No.: 09/726,654

(22) Filed: Dec. 1, 2000

(65) Prior Publication Data

US 2001/0003056 A1 Jun. 7, 2001

(30) Foreign Application Priority Data

Dec. 3, 1999 (JP) ............................................. 11-344340

(51) Int. Cl.[7] ............................................. H01L 21/336
(52) U.S. Cl. .................... 438/664; 438/682; 438/305
(58) Field of Search ................................ 438/664, 682, 438/FOR 356, 301, 305

(56) References Cited

U.S. PATENT DOCUMENTS

| | | | |
|---|---|---|---|
| 5,624,869 A | * | 4/1997 | Agnello et al. |
| 5,953,614 A | * | 9/1999 | Liu et al. |
| 5,989,988 A | * | 11/1999 | Iinuma et al. |
| 6,080,648 A | * | 6/2000 | Nagashima et al. |
| 6,083,817 A | * | 7/2000 | Nogami et al. |
| 6,096,647 A | * | 8/2000 | Yang et al. |
| 6,127,267 A | * | 10/2000 | Matsubara et al. |
| 6,165,903 A | * | 12/2000 | Besser et al. |
| 6,235,568 B1 | * | 5/2001 | Murthy et al. |
| 6,274,470 B1 | * | 8/2001 | Ichimori et al. |
| 6,297,136 B1 | * | 10/2001 | Son |
| 6,337,272 B1 | * | 1/2002 | Hamanaka |
| 6,440,851 B1 | * | 8/2002 | Agnello et al. |

FOREIGN PATENT DOCUMENTS

| | | |
|---|---|---|
| JP | 07-86559 | 3/1995 |
| JP | 09-289249 | 11/1999 |

* cited by examiner

*Primary Examiner*—George Fourson
*Assistant Examiner*—Joannie Adelle Garcia
(74) *Attorney, Agent, or Firm*—Nixon Peabody LLP; Donald R. Studebaker (57) ABSTRACT

After a cobalt film is deposited on a silicon-containing film formed on a semiconductor substrate, a first heat treatment at a relatively low temperature is performed with respect to the semiconductor substrate to cause a reaction between the cobalt film and the silicon layer and thereby form a $Co_2Si$ layer or CoSi layer in at least a surface portion of the silicon layer. Then, a silicon-containing film is deposited on the $Co_2Si$ layer or CoSi layer and a second heat treatment at a relatively high temperature is performed with respect to the semiconductor substrate to cause a reaction between the silicon-containing film and the $Co_2Si$ layer or CoSi layer and thereby form a $CoSi_2$ layer in at least a surface portion of the silicon layer.

3 Claims, 9 Drawing Sheets

METHOD FOR FABRICATING SEMICONDUCTOR DEVICE

BACKGROUND OF THE INVENTION

The present invention relates to technology for forming a cobalt silicide layer in a surface portion of a silicon layer formed on a semiconductor substrate, e.g., in a surface portion of a gate electrode composed of a polysilicon film or in a surface portion of an impurity diffused layer formed in a silicon substrate.

With the recent miniaturization of semiconductor devices, a semiconductor integrated circuit device has encountered various problems such as an increase in signal delay time caused by, e.g., an increase in the resistance of a contact or an impurity diffused layer and electric conduction between a gate electrode and the contact connecting to the impurity diffused layer caused by alignment offset.

As a method for solving the former problem, there has been proposed a salicide process as disclosed in, e.g., Japanese Unexamined Patent Publication No. HEI 7-86559, wherein a cobalt silicide layer is formed in a surface portion of a gate electrode or of an impurity diffused layer serving as a source or drain region in a MOS transistor.

A description will be given to a salicide process disclosed in Japanese Unexamined Patent Publication No. HEI 7-86559 as a first conventional embodiment. After a gate electrode composed of a polysilicon film is formed on a silicon substrate and an impurity diffused layer serving as a source or drain region is formed in the silicon substrate, a cobalt film and a titanium film are deposited successively over the entire surface of the silicon substrate. Then, a heat treatment is performed to cause a reaction between the cobalt and titanium films and the polysilicon film or the impurity diffused layer, whereby a cobalt silicide layer is formed in respective surface portions of the gate electrode and the impurity diffused layer. The titanium film is formed on the cobalt film with the view to lowering the surface energy of the cobalt silicide layer and thereby preventing agglomeration in a surface portion of the cobalt silicide layer.

The formation of the cobalt silicide layer in the surface portions of the gate electrode and the impurity diffused layer thus suppresses an increase in the resistance of each of a contact and the impurity diffused layer and thereby implements a higher-speed semiconductor integrated circuit device.

As a method for solving the latter problem, there has been proposed a self-aligned contact (SAC). In response to the miniaturization of a semiconductor device, the method forms an insulating film composed of a silicon oxide film on the upper and side surfaces of a gate electrode, deposits a liner film over the entire surface of the insulating film, deposits an interlayer insulating film composed of a silicon oxide film on the liner film, and forms, in the interlayer insulating film, a contact hole connected to an impurity diffused layer serving as a source or drain region. In accordance with the method, no electric conduction occurs between a metal film buried in the contact hole and the gate electrode since the insulating film is present on the gate electrode even if the contact hole is formed partly above the gate electrode.

To implement the self-aligned contact, however, the insulating film and the liner film should be deposited on the gate electrode. This causes the problem that a surface portion of the gate electrode cannot be silicidized during the formation of the self-aligned contact.

To solve the problem, Japanese Unexamined Patent Publication No. HEI 9-289249 proposes a method for a trade-off between the self-aligned contact and the salicide process.

A description will be given to a salicide process disclosed in Japanese Unexamined Patent Publication No. HEI 9-289249 as a second conventional embodiment. In the salicide process, a first offset oxide film is formed on the upper surface of a gate electrode, sidewalls are formed on the respective side surfaces of the gate electrode and the first offset oxide film, and the first offset oxide film is removed such that the gate electrode is exposed and a depressed portion is formed internally of the sidewalls. Then, a cobalt film is deposited all over and subjected to a heat treatment, whereby a cobalt silicide layer is formed in respective surface portions of the gate electrode and an impurity diffused layer. Subsequently, a second offset oxide film is formed on the cobalt silicide layer on the gate electrode to be buried in the depressed portion and a liner film and an interlayer insulating film are deposited successively all over. Thereafter, a contact hole connecting to the impurity diffused layer as a source or drain region is formed in the interlayer insulating film.

However, the salicide process according to the first conventional embodiment encounters a first problem that the vertical position of a top surface (upper surface) of the silicon layer lowers greatly in the direction of the depth of the substrate in the process in which a reaction occurs between Co atoms composing the cobalt film and Si atoms composing the polysilicon film serving as the gate electrode or the impurity diffused layer in the silicon substrate as the source or drain region (hereinafter the polysilicon film and the impurity diffused layer are collectively referred to as a silicon layer) to form the cobalt silicide layer. This is because the Si atoms in the silicon layer are consumed in a large quantity while a reaction occurs between the Co atoms composing the cobalt film and the Si atoms composing the silicon layer to form the cobalt silicide layer, so that the vertical position of the top surface of the silicon layer moves greatly in the direction of the depth of the substrate.

To provide the silicon layer which is sufficiently thick after the formation of the cobalt silicide layer, the silicon layer prior to the formation of the cobalt silicide layer should have a sufficient thickness. This causes the problem that a shallow pn junction cannot be obtained and hence miniaturization cannot be achieved. To obtain the shallow pn junction, on the other hand, the vertical position of the top surface of the silicon layer lowers in the direction of the depth of the substrate and the thickness of the silicon layer is reduced, which causes a junction leakage current.

The salicide process according to the second conventional embodiment allows both formation of the silicide layer in the surface portion of the gate electrode and formation of the self-aligned contact in the source or drain region. However, the salicide process according to the second conventional embodiment has the problem of an extremely large number of process steps since, after the first offset oxide film and the sidewalls are formed, the first offset oxide film is removed such that the depressed portion is formed internally of the sidewalls, the cobalt suicide layer and the second offset oxide film are formed successively, and then the liner film and the interlayer insulating film are deposited.

SUMMARY OF THE INVENTION

In view of the foregoing, a first object of the present invention is to prevent the vertical position of the top surface of the silicon layer from moving greatly in the direction of the depth of the substrate even if cobalt silicide is formed. A second object of the present invention is to form both of the suicide layer and the self-aligned contact without increasing the number of process steps.

(First Principle of Solution)

To attain the first object, the present inventors examined the mechanism of the formation of a cobalt silicide layer through a reaction between Co atoms composing a cobalt film and Si atoms composing a silicon layer and found a first principle of solution, which will be described below.

From a thermodynamic viewpoint, the mechanism of the formation of a cobalt silicide (to be precise, a monocobalt disilicide but hereinafter referred to as a cobalt silicide for the sake of convenience) through a reaction between Co atoms and Si atoms is the proceeding of the reaction of $Co_2Si$ (dicobalt monosilicide)→CoSi (monocobalt monosilicide)→$CoSi_2$ (monocobalt disilicide).

The respective molar volumes ($cm^3$/mol) of a cobalt film, a silicon-containing film, a $Co_2Si$ layer, CoSi layer, and $CoSi_2$ layer are 6.62, 12.04, 13.1, 19.7, and 23.3.

If rapid thermal annealing (RTA) involving stepwise increases in temperature is performed after the deposition of the cobalt film on the silicon layer, a first reaction represented by $2Co+Si→Co_2Si$ occurs at a temperature of, e.g., 400° C. In the process in which the first reaction occurs, the volume of the silicon layer contributing to the first reaction is 0.91 and the volume of the $Co_2Si$ layer obtained is 1.49 if the volume of the cobalt film contributing to the first reaction is 1.

Then, a second reaction represented by $Co_2Si+Si→2CoSi$ occurs at a temperature of, e.g., 500° C . In the process in which the second reaction occurs, the volume of the $Co_2Si$ layer contributing to the second reaction is 1.49, the volume of the silicon layer contributing to the second reaction is 0.91, and the volume of the CoSi layer obtained is 1.98 if the volume of the cobalt film contributing to the foregoing first reaction is 1.

Then, a third reaction represented by $CoSi+Si→CoSi_2$ occurs at a temperature of, e.g., 800° C. In the process in which the third reaction occurs, the volume of the CoSi layer contributing to the third reaction is 1.98, the volume of the silicon layer contributing to the third reaction is 1.82, and the volume of the $CoSi_2$ layer obtained is 3.54 if the volume of the cobalt film contributing to the foregoing first reaction is 1.

As will be understood from the foregoing description, if the volume of the cobalt film contributing to the first reaction is 1, the silicon layer is consumed by a volume of 0.91 in the first reaction, by a volume of 0.91 in the second reaction, and by a volume of 1.82 in the third reaction.

Figure 9A:
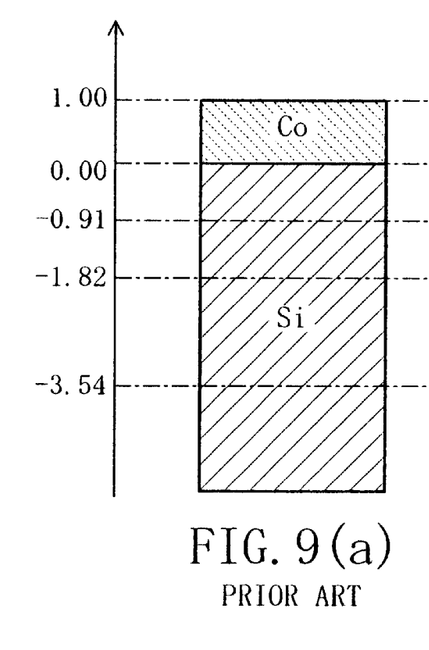
FIGS. 9a–9d are views schematically showing the problem of the conventional semiconductor device.
Figure 9B:
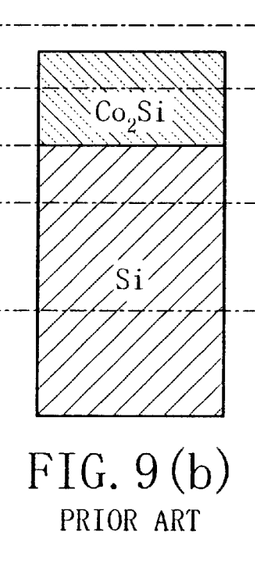
Figure 9C:
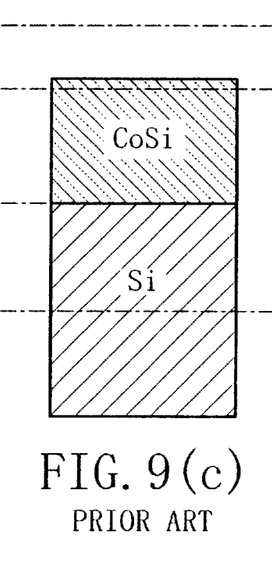
Figure 9D:
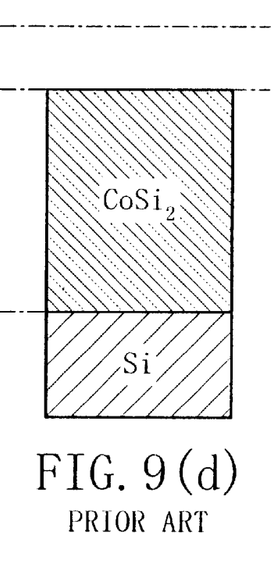

FIGS. 9(a) to (d) show the vertical position of the interface between the cobalt film and the silicon-containing film (the position of the top surface of the silicon layer) in the process in which a reaction occurs between Co atoms and Si atoms to form $CoSi_2$, of which FIG. 9(a) shows the state prior to the first reaction, FIG. 9(b) shows the state after the first reaction, FIG. 9(c) shows the state after the second reaction, and FIG. 9(d) shows the state after the third reaction. In FIGS. 9(a) to (d), the vertical position of the interface of the silicon layer before a reaction occurs between Co atoms and Si atoms is set to 0.

As can bee seen from FIGS. 9(a) to (d), the vertical position of the interface of the silicon layer lowers by 0.91 after the first reaction, lowers by 1.82 after the second reaction, and lowers by 3.54 after the third reaction.

As a result of examining the foregoing reaction mechanism, the present inventors found that the consumption of Si atoms in the substrate-side silicon layer can be suppressed if the $CoSi_2$ layer is formed by depositing a silicon-containing film on a surface of the $Co_2Si$ layer or CoSi layer at a mid-stage of the formation of $COSi_2$ through the reaction between Co atoms and Si atoms, i.e., at a stage at which $Co_2Si$ or CoSi has been formed and then performing a heat treatment, since Co atoms in the $Co_2Si$ layer or CoSi layer react with Si atoms in the silicon-containing film. A description will be given below to the reason that the vertical position of the interface of the silicon layer is inhibited from moving in the direction of the depth of the substrate based on the foregoing finding. Since the reaction of $Co_2Si→CoSi→CoSi_2$ proceeds with the rising of the temperature during the heat treatment, the reaction can be stopped at the stage at which $Co_2Si$ or CoSi has been formed.

(1) A description will be given below to the reaction mechanism when $CoSi_2$ is formed by depositing the Si film on the surface of the $Co_2Si$ layer at the stage at which the $Co_2Si$ layer has been formed and then performing a high-temperature heat treatment.

Figure 1A:
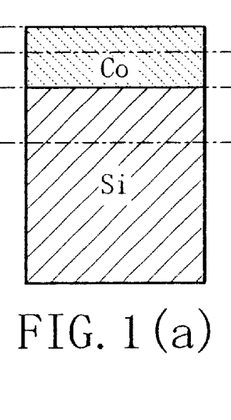
FIGS. 1a–1d are views schematically showing the first principle of solution.
Figure 1B:
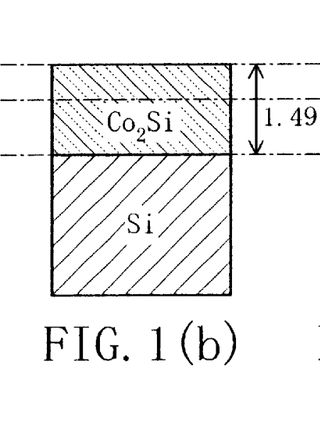
Figure 1C:
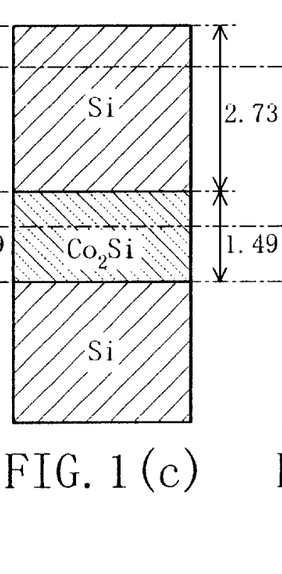
Figure 1D:
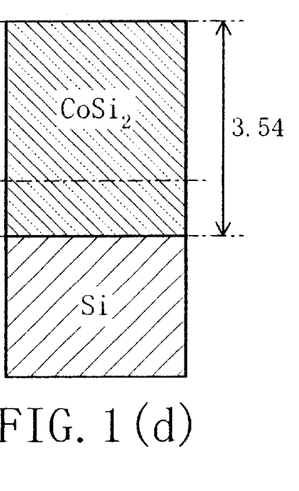

FIGS. 1(a) to (d) show the vertical position of the interface of the silicon layer in the process in which a reaction occurs between Co atoms and Si atoms to generate $CoSi_2$, of which FIG. 1(a) shows the state in which a cobalt film has been deposited, FIG. 1(b) shows the state in which the $Co_2Si$ layer has been formed, FIG. 1(c) shows the state in which the silicon-containing film has been deposited on the $Co_2Si$ layer, and FIG. 1(d) shows the state in which the $CoSi_2$ layer has been formed. In FIGS. 1(a) to (d), the vertical position of the interface of the silicon layer and the vertical position of the top surface of the cobalt film before the reaction occurs between Co atoms and Si atoms are set to 0 and 1.00, respectively. The respective molar volumes ($cm^3$/mol) of the cobalt film, the silicon film (silicon layer), the $Co_2Si$ layer, and the $CoSi_2$ layer are as described above.

First, as shown in FIG. 1(a), the cobalt film is deposited on the silicon layer and then the first heat treatment at 400° C. is performed such that a reaction occurs between Si atoms and Co atoms to form the $Co_2Si$ layer, as shown in FIG. 1(b). In this case, the volume of the $Co_2Si$ layer obtained is 1.49 if the volume of the cobalt film is 1, similarly to the conventional embodiment (see the aforementioned first reaction). From a comparison between FIGS. 1(a) and (b), it will be understood that the vertical position of the interface of the silicon layer has lowered by 0.91 and the vertical position of the top surface of the $Co_2Si$ layer is 0.58 when the $Co_2Si$ layer has been formed.

Next, as shown in FIG. 1(c), a silicon-containing film having a height of 2.73 is deposited by, e.g., CVD on the $Co_2Si$ layer and then a second heat treatment at, e.g., 800° C. is performed, whereby the $CoSi_2$ layer is formed as shown in FIG. 1(d). Since the occurring reaction is represented by the formula of $Co_2Si+3Si→2CoSi_2$, a reaction occurs between the $Co_2Si$ layer having a volume of 1.49 and the silicon-containing film having a volume of 2.73 to obtain the $CoSi_2$ layer having a volume of 3.54. As a result, the vertical position of the interface of the silicon layer remains −0.91 and the vertical position of the top surface of the $CoSi_2$ layer is 3.21. The volume of the silicon-containing film (film thickness) need not necessarily be 2.73 but the silicon-containing film preferably has a thickness of 2.73 or more since the reaction represented by $Co_2Si+3Si→2CoSi_2$ occurs without an excess or deficiency of Si and Co atoms if the thickness of the silicon-containing film is 2.73 or more.

From a comparison between FIGS. 1(d) and 9(d), it will be understood that the vertical position of the interface of the silicon layer is higher by 2.63 than in the conventional embodiment and the vertical position of the top surface of the $CoSi_2$ layer is also much higher than in the conventional embodiment.

(2) A description will be given below to the reaction mechanism when $CoSi_2$ is formed by depositing the Si film on the surface of the CoSi layer at the stage at which the CoSi layer has been formed and then performing a high-temperature heat treatment.

Figure 2A:
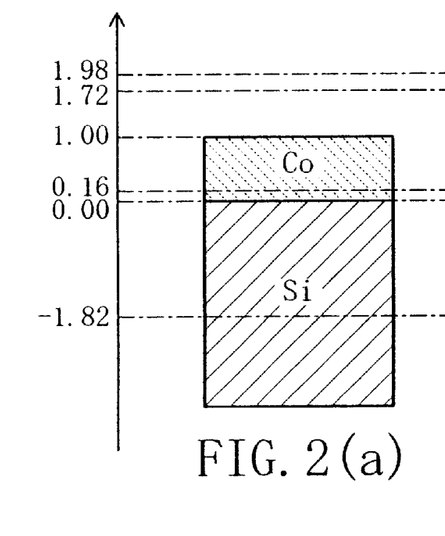
FIGS. 2a–2d are views schematically showing the second principle of solution.
Figure 2B:
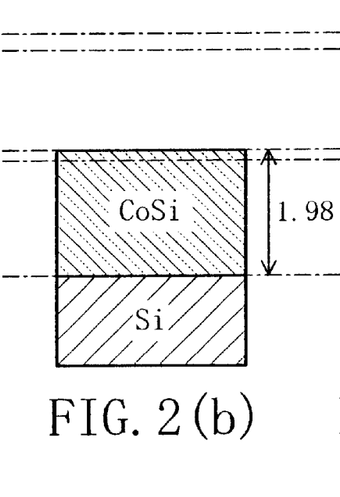
Figure 2C:
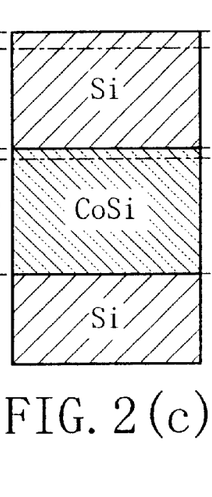
Figure 2D:
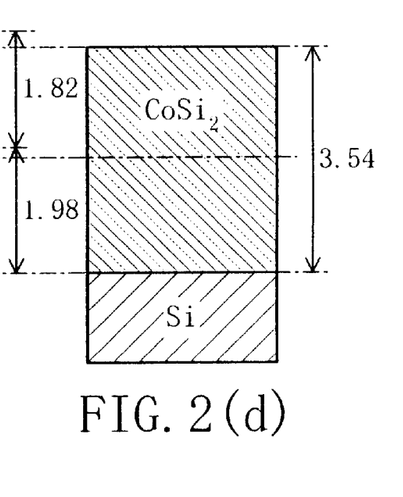

FIGS. 2(a) to (d) show the vertical position of the interface of a silicon layer in the process in which a reaction occurs between Co atoms and Si atoms to generate $CoSi_2$, of which FIG. 2(a) shows the state in which the cobalt film has been deposited, FIG. 2(b) shows the state in which the CoSi layer has been formed, FIG. 2(c) shows the state in which a silicon-containing film has been deposited on the CoSi layer, and FIG. 2(d) shows the state in which the $CoSi_2$ layer has been formed. In FIGS. 2(a) to (d), the vertical position of the interface of the silicon layer and the vertical position of the top surface of the cobalt film before a reaction occurs between Co atoms and Si atoms are set to 0 and 1.00, respectively. The respective molar volumes (cm³/mol) of the cobalt film, the silicon film (silicon layer), the CoSi layer, and the $CoSi_2$ layer are as described above.

First, as shown in FIG. 2(a), the cobalt film is deposited on the silicon layer and then the first heat treatment at 500° C. is performed such that a reaction occurs between Si atoms and Co atoms to form the CoSi layer, as shown in FIG. 2(b). In this case, the volume of the CoSi layer obtained is 1.98 if the volume of the cobalt film is 1, similarly to the conventional embodiment (see the aforementioned second reaction). From a comparison between FIGS. 2(a) and (b), it will be understood that the vertical position of the interface of the silicon layer has lowered by 1.82 and the position of the top surface of the CoSi layer is 0.16 when the CoSi layer has been formed.

Next, as shown in FIG. 2(c), a silicon-containing film having a height of 1.82 is deposited by, e.g., CVD on the CoSi layer and then a second heat treatment at, e.g., 800° C. is performed, whereby the $CoSi_2$ layer is formed as shown in FIG. 2(d). Since the occurring reaction is represented by the formula of $CoSi+Si \rightarrow CoSi_2$, a reaction occurs between the CoSi layer having a volume of 1.98 and the silicon-containing film having a volume of 1.82 to obtain the $CoSi_2$ layer having a volume of 3.54. As a result, the vertical position of the interface of the silicon layer remains −1.82 and the vertical position of the top surface of the $CoSi_2$ layer is 1.72. The thickness of the silicon-containing film need not necessarily be 1.82 but the silicon-containing film preferably has a thickness of 1.82 or more since the reaction represented by $CoSi+Si \rightarrow CoSi_2$ occurs without an excess or deficiency of Si and Co atoms if the thickness of the silicon-containing film is 1.82 or more.

From a comparison between FIGS. 2(d) and 9(d), it will be understood that the vertical position of the interface of the silicon layer is higher by 1.72 than in the conventional embodiment and the vertical position of the top surface of the $CoSi_2$ layer is also much higher than in the conventional embodiment.

(3) A description will be given to the reason that Si atoms in the deposited silicon-containing film are preferentially consumed, while Si atoms in the substrate-side silicon layer are barely consumed, when the $CoSi_2$ layer is formed by depositing the silicon-containing film by CVD and performing a second heat treatment, as shown in FIG. 1(c) or 2(c).

The substrate-side silicon layer is composed of single-crystal silicon, while the silicon-containing film deposited by CVD is composed of polysilicon or amorphous silicon. As a result, the substrate-side silicon layer contains few dangling bonds, while the silicon-containing film deposited by CVD is rich in defects (defect-rich) so that it contains a large number of dangling bonds. Accordingly, the reaction speed at which Co atoms are bonded to the Si atoms in the deposited silicon-containing film is incomparably higher than the reaction speed at which Co atoms are bonded to the Si atoms in the substrate-side silicon layer, so that the majority of the Co atoms composing the $Co_2Si$ layer or CoSi layer are bonded to the Si atoms in the deposited silicon-containing film. Consequently, the Si atoms in the substrate-side silicon layer are barely consumed so that the vertical position of the interface of the silicon layer hardly changes.

(4) In the salicide process according to the first conventional embodiment, the temperature of the heat treatment increases stepwise during the process during which a reaction occurs between the Co atoms composing the cobalt film and the Si atoms composing the silicon layer to form the cobalt silicide layer. Accordingly, the respective surface energies of the $Co_2Si$ layer, the CoSi layer, and the $CoSi_2$ layer increase to be higher than the energy at the interface between the silicide layer and the silicon layer. This causes agglomeration at the respective surfaces of the $Co_2Si$ layer, the CoSi layer, and the $CoSi_2$ layer in the reaction process so that non-uniform reaction thickness is observed disadvantageously at the surface of the $CoSi_2$ layer finally formed. The non-uniform reaction thickness observed at the surface of the $CoSi_2$ layer presents the problem that an open wire is likely to occur in the cobalt silicide layer.

However, non-uniform reaction thickness variation is less likely to occur at the surface of the $CoSi_2$ layer if the $CoSi_2$ layer is formed by depositing the silicon-containing film on the $Co_2Si$ layer or CoSi layer and then performing the second heat treatment as described above. If the second heat treatment, i.e., the high-temperature heat treatment at, e.g., 800° C. is performed after the deposition of the silicon-containing film on the $Co_2Si$ layer or CoSi layer, the surface of the $Co_2Si$ layer or the CoSi layer is prevented from being exposed during the high-temperature reaction so that the surface portion of the $Co_2Si$ layer or CoSi layer is silicon-rich and therefore the surface energy of the $Co_2Si$ layer or CoSi layer is lower than in the conventional embodiment. As a result, agglomeration is less likely to occur at the surface of the $Co_2Si$ layer or CoSi layer so that the $CoSi_2$ layer with good uniformity in reaction thickness is obtained.

A first method for fabricating a semiconductor device is the invention embodying the foregoing first principle of solution and comprises the steps of: depositing a cobalt film on a silicon layer formed on a semiconductor layer; performing a first heat treatment at a relatively low temperature with respect to the semiconductor substrate to cause a reaction between the cobalt film and the silicon layer and thereby form a $Co_2Si$ layer or CoSi layer in at least a surface portion of the silicon layer; depositing a silicon-containing film on the $Co_2Si$ layer or CoSi layer; and performing a second heat treatment at a relatively high temperature with respect to the semiconductor substrate to cause a reaction between the silicon-containing film and the $Co_2Si$ layer or CoSi layer and thereby form a $CoSi_2$ layer in at least a surface portion of the silicon layer.

In accordance with the first method for fabricating a semiconductor device, the silicon-containing film is deposited on the $Co_2Si$ layer or CoSi layer and then the second heat treatment at a relatively high temperature is performed so that the majority of Co atoms in the $Co_2Si$ layer or CoSi layer react with Si atoms in the silicon-containing film. As a result, the vertical position of the interface of the silicon layer hardly moves downward during the formation of the $CoSi_2$ layer.

Since the silicon-containing film has been deposited on the $Co_2Si$ layer or CoSi layer when the second heat treatment at a relatively high temperature is performed, the surface portion of the $Co_2Si$ layer or CoSi layer is not exposed during the high-temperature reaction and is therefore silicon-rich so that the surface energy of the $Co_2Si$ layer or CoSi layer is lower than in the conventional embodiment. As a result, agglomeration is less likely to occur at the surface of the $Co_2Si$ layer or CoSi layer so that the $CoSi_2$ layer with uniform reaction thickness is obtained.

In the first method for fabricating a semiconductor device, the silicon-containing film preferably has a thickness such that the reaction occurs between Si atoms in the silicon-containing film and Co atoms in the $Co_2Si$ layer or CoSi layer without an excess or deficiency of Si and Co atoms.

The configuration positively prevents the vertical position of the interface of the silicon layer from moving downward.

If the silicon-containing film has a thickness such that a reaction occurs between Si atoms in the silicon-containing film and Co atoms in the $Co_2Si$ layer or CoSi layer without an excess or deficiency of Si and Co atoms, it is preferable that the silicon layer is an impurity diffused layer serving as a source or drain region of a field-effect transistor and the $CoSi_2$ layer is an electrode formed in a surface portion of the impurity diffused layer.

In the configuration, Si atoms in the impurity diffused layer serving as the source or drain region of the field-effect transistor hardly react with the Co atoms in the cobalt film so that the vertical position of the bottom surface of the impurity diffused layer hardly moves toward the substrate. As a result, there can be formed a MOS transistor having an elevated source/drain structure (a so-called raised source/drain structure). This allows formation of the cobalt silicide layer in the surface portion of the impurity diffused layer serving as the source or drain region, which is for preventing an increase in parasitic resistance, and formation of the impurity diffused layer with a shallow pn junction, which is for preventing a short-channel effect, without increasing a junction leakage current and adding a new process step.

If the silicon-containing film has a thickness such that a reaction occurs between Si atoms in the silicon-containing film and Co atoms in the $Co_2Si$ layer or CoSi layer without an excess or deficiency of Si and Co atoms, it is preferable that the silicon layer is a patterned polysilicon film and the $CoSi_2$ layer and the polysilicon film integrally compose a gate electrode of a field-effect transistor.

The configuration allows formation of the $CoSi_2$ layer with uniform reaction thickness, without agglomeration and reduces the resistance of the gate electrode composed of a multilayer structure consisting of the $CoSi_2$ layer and the polysilicon film.

If the silicon-containing film has a thickness such that a reaction occurs between Si atoms in the silicon-containing film and Co atoms in the $Co_2Si$ layer or CoSi layer without an excess or deficiency of Si and Co atoms, it is preferable that the silicon layer includes an impurity diffused layer serving as a source or drain region of a field-effect transistor and a patterned polysilicon film and the $CoSi_2$ layer is an electrode formed in a surface portion of the impurity diffused layer and singly composing a gate electrode of the field-effect transistor.

In the configuration, the vertical position of the impurity diffused layer serving as the source or drain region hardly moves toward the substrate. This allows formation of a MOS transistor having an elevated source/drain structure and a gate electrode composed of a cobalt silicide.

(Second Principle of Solution)

To attain the second object, the present inventors examined the salicide process according to the second conventional embodiment and found a second principle of solution, which will be described below. Specifically, the second principle of solution is such that the step of depositing the first offset film need not be performed any more if the depressed portion is formed over the upper surface of the gate electrode and internally of the sidewalls by forming the sidewalls on the side surfaces of the gate electrode and removing the surface portion of the gate electrode, instead of forming the depressed portion over the upper surface of the gate electrode and internally of the sidewalls by forming the first offset oxide film on the upper surface of the gate electrode, forming the sidewalls on the respective side surfaces of the gate electrode and the first offset oxide film, and then removing the first offset oxide film and that a self-aligned contact can be implemented without depositing the second offset oxide film since, if the liner film is deposited without forming the second offset oxide film on the cobalt silicide layer on the gate electrode, an etching stopper can be deposited along the inner wall surfaces of the depressed portion.

A second method for fabricating a semiconductor device is the invention embodying the foregoing second principle of solution and comprises the steps of: forming, on a silicon substrate, a patterned polysilicon film composing a gate electrode and forming, in surface portions of the silicon substrate located on both sides of the polysilicon film, impurity diffused layers each serving as a source or drain region, while forming sidewalls composed of a first insulating film on side surfaces of the polysilicon film on the silicon substrate; removing a surface portion of the polysilicon film to form a depressed portion over the polysilicon film and internally of the sidewalls; forming a cobalt silicide layer in a surface portion of each of the polysilicon film and the impurity diffused layers; forming a liner film composed of a second insulating film such that it extends along an upper surface of the cobalt silicide layer on the polysilicon film, inner and outer wall surfaces of the sidewalls, and an upper surface of the cobalt silicide layer in each of the impurity diffused layers; depositing an interlayer insulating film on the liner film; and performing selective etching with respect to the interlayer insulating film and the liner film to form a contact hole for exposing therein the cobalt silicide layer in each of the impurity diffused layers.

In accordance with the second method for fabricating a semiconductor device, the liner film is formed to extend along the upper surface of the cobalt silicide layer on the polysilicon film, the inner and outer wall surfaces of the sidewalls, and the upper surface of the cobalt silicide layer in each of the impurity diffused layers and then the interlayer insulating film is deposited on the liner film. Consequently, an etching stopper is interposed between the contact hole formed in the interlayer insulating film and the gate electrode. As a result, a connection between the gate electrode and the conductive film buried in the contact hole is circumvented even if the contact hole is displaced so that a self-aligned contact is implemented.

Since the depressed portion is formed over the polysilicon film and internally of the sidewalls by removing the surface portion of the polysilicon film as the gate electrode, the first offset oxide film required in the second conventional embodiment is no more necessary. Since the liner film is formed to extend along the upper surface of the cobalt silicide layer on the polysilicon film, the inner and outer wall surfaces of the sidewalls, and the upper surface of the cobalt silicide layer in each of the impurity diffused layers, the second offset oxide film required in the second conventional embodiment is no more necessary so that a self-aligned contact is implemented in a reduced number of process steps.

In the second method for fabricating a semiconductor device, each of the impurity diffused layers preferably has an LDD structure formed by ion implanting an impurity at a low concentration by using the polysilicon as a mask and then ion implanting an impurity at a high concentration by using the polysilicon film and the sidewalls as a mask.

In the configuration, the sidewalls for forming an LDD structure can be used to form the liner film extending along the upper surface of the cobalt silicide layer on the polysilicon film, the inner and outer wall surfaces of the sidewalls, and the upper surface of the cobalt silicide layer in each of the impurity diffused layers. As a result, there can be implemented a self-aligned contact without increasing the number of process steps.

In the second method for fabricating a semiconductor device, the step of forming the cobalt silicide layer preferably includes the steps of: depositing a cobalt film over the polysilicon film and the impurity diffused layers; performing a first heat treatment at a relatively low temperature with respect to the silicon substrate to cause a reaction between the cobalt film and each of the polysilicon film and the impurity diffused layers and thereby form a $Co_2Si$ layer or CoSi layer in a surface portion of each of the polysilicon film and the impurity diffused layers; depositing a silicon-containing film on the $Co_2Si$ layer or CoSi layer; and performing a second heat treatment at a relatively high temperature with respect to the silicon substrate to cause a reaction between the silicon-containing film and the $Co_2Si$ layer or CoSi layer and thereby form a $CoSi_2$ layer in a surface portion of each of the polysilicon film and the impurity diffused layers.

In the configuration, the vertical position of the interface of the silicon layer hardly moves downward during the formation of the $CoSi_2$ layer and the $CoSi_2$ layer with uniform reaction thickness without agglomeration is obtained, similarly to the first method for fabricating a semiconductor device.

A semiconductor device according to the present invention comprises: an impurity diffused layer formed in a silicon substrate to serve as a source region or drain region; and a cobalt silicide layer formed in a surface portion of the impurity diffused layer, the cobalt silicide layer having a configuration such that a vertical position of an upper surface thereof is higher than a vertical position of an upper surface of the silicon substrate and an area of the upper surface thereof is larger than an area of a lower surface thereof.

In the semiconductor device of the present invention, the vertical position of the upper surface of the cobalt silicide layer formed in the surface portion of the impurity diffused layer serving as the source or drain region is higher than the vertical position of the upper surface of the silicon substrate so that an elevated source/drain structure is implemented. This allows formation of the cobalt silicide layer in the surface portion of the impurity diffused layer serving as the source or drain region, which is for preventing an increase in parasitic resistance, and formation of the impurity diffused layer with a shallow pn junction, which is for preventing a short-channel effect.

Since the area of the upper surface of the cobalt silicide layer is larger than the area of the lower surface thereof, a reduction in the contact area between the cobalt silicide layer and the conductive film buried in the contact hole is prevented even if the contact hole connecting to the cobalt silicide layer is slightly displaced.

DETAILED DESCRIPTION OF THE INVENTION

EMBODIMENT 1

Referring now to FIGS. 3(a) to (c), FIGS. 4(a) to (c), FIGS. 5(a) to (c), FIGS. 6(a) to (c), and FIGS. 7(a) and (b), a method for fabricating a semiconductor device according to a first embodiment of the present invention will be described. The first embodiment is for implementing both of the first and second principles of solution described above in SUMMARY OF THE INVENTION.

Figure 3A:
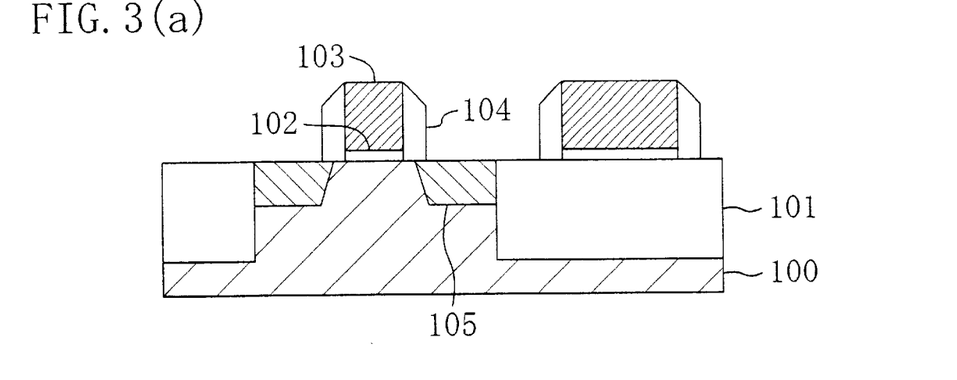
FIGS. 3(a) to (c) are cross-sectional views illustrating the individual process steps of a method for fabricating a semiconductor device according to a first embodiment of the present invention.

First, as shown in FIG. 3(a), an isolation region 101 is formed in a surface portion of a silicon substrate 100. Then, a polysilicon film 103 patterned to form a gate electrode is formed on the region of the silicon substrate 100 surrounded by the isolation region 101 via a gate insulating film 102. The polysilicon film has also been formed on the isolation region 101 to serve as a resistor. Subsequently, an impurity at a low concentration is ion implanted into the silicon substrate 100 by using the polysilicon film 103 as a mask. Then, sidewalls 104 are formed on the side surfaces of the polysilicon film 103. Thereafter, an impurity at a high concentration is ion implanted into the silicon substrate 100 by using, as a mask, the polysilicon film 103 and the sidewalls 104, whereby impurity diffusion layers 105 each having an LDD structure and serving as a source or drain region are formed.

Figure 3B:
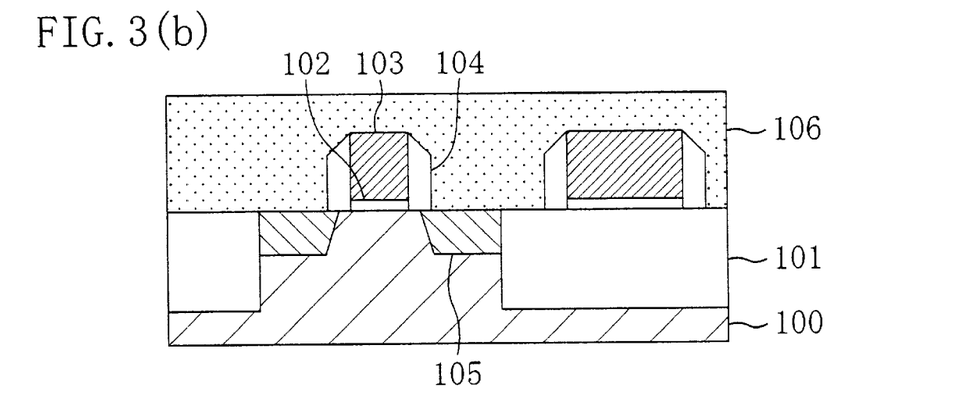
Figure 3C:
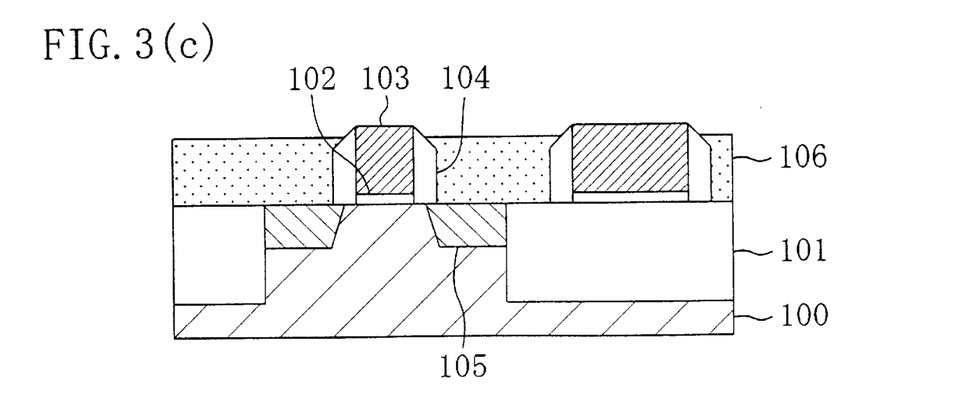

Next, as shown in FIG. 3(b), a resist film 106 is coated on the entire surface of the silicon substrate 100 and etched back, as shown in FIG. 3(c), so that a surface of the polysilicon film 103 is exposed.

Figure 4A:
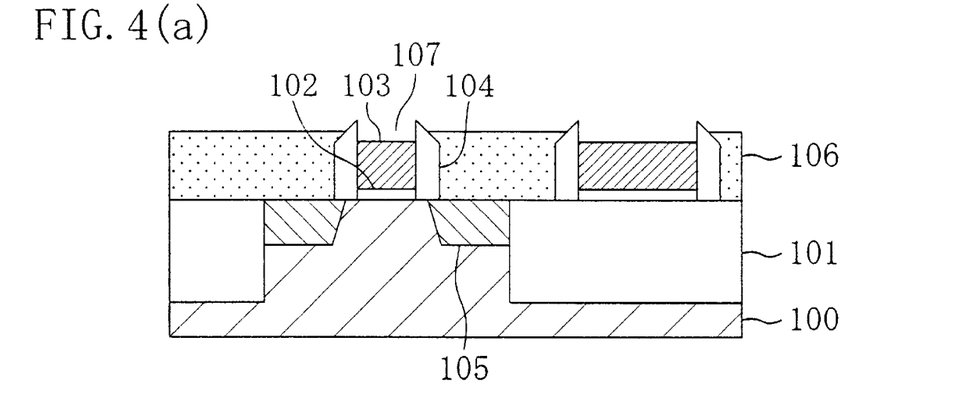
FIGS. 4(a) to (c) are cross-sectional views illustrating the individual process steps of the method for fabricating the semiconductor device according to the first embodiment.
Figure 4B:
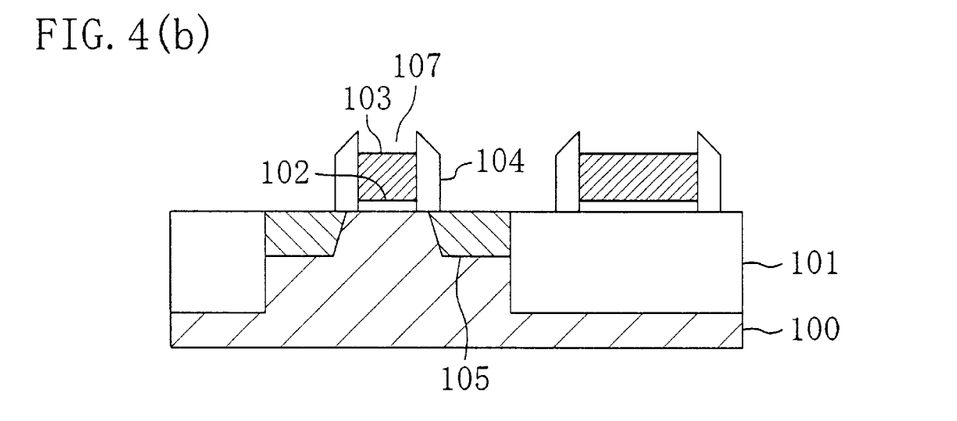

Next, as shown in FIG. 4(a), dry etching is performed by using an etching gas capable of selectively etching the polysilicon film to selectively etch back a surface of the polysilicon film 103 and thereby form a depressed portion 107 internally of the sidewalls 104 and over the polysilicon film 103. The resist film 106 is then removed, as shown in FIG. 4(b).

Figure 4C:
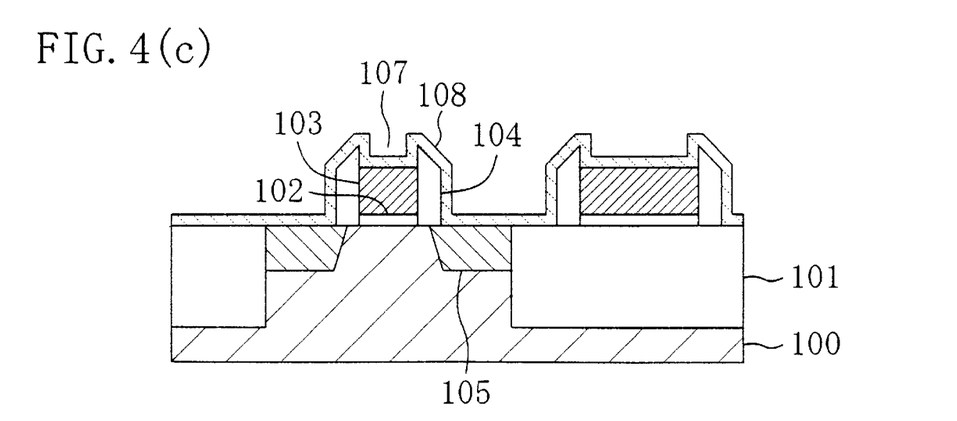
Figure 5A:
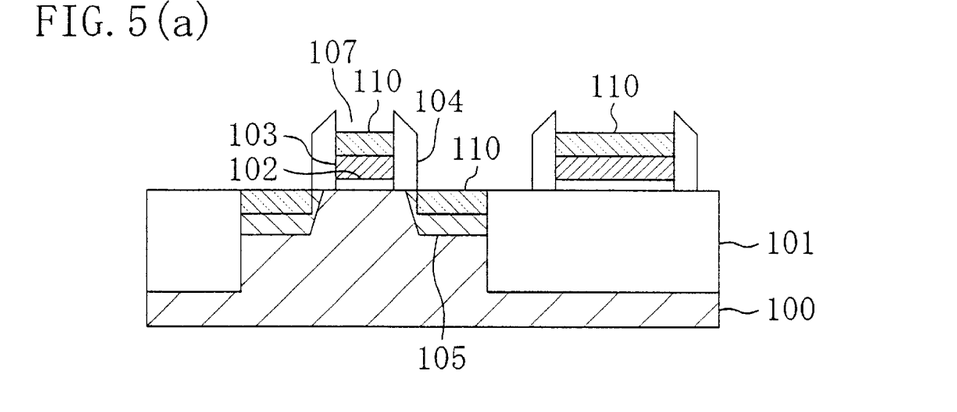
FIGS. 5(a) to (c) are cross-sectional views illustrating the individual process steps of the method for fabricating the semiconductor device according to the first embodiment.

Next, as shown in FIG. 4(c), a cobalt film 108 is deposited over the entire surface of the silicon substrate 100. Then, a first heat treatment (RTA) at a low temperature of, e.g., 500° C. is performed with respect to the silicon substrate 100, thereby forming a CoSi layer 110 in a surface portion of each of the polysilicon film 103 and the impurity diffusion layers 105, as shown in FIG. 5(a). If the first heat treatment is performed at a temperature of, e.g., 400° C., a $Co_2Si$ layer is formed instead of the CoSi layer 110. After that, the portion of the cobalt film 108 unreacted with Si atoms is removed by wet etching.

Figure 5B:
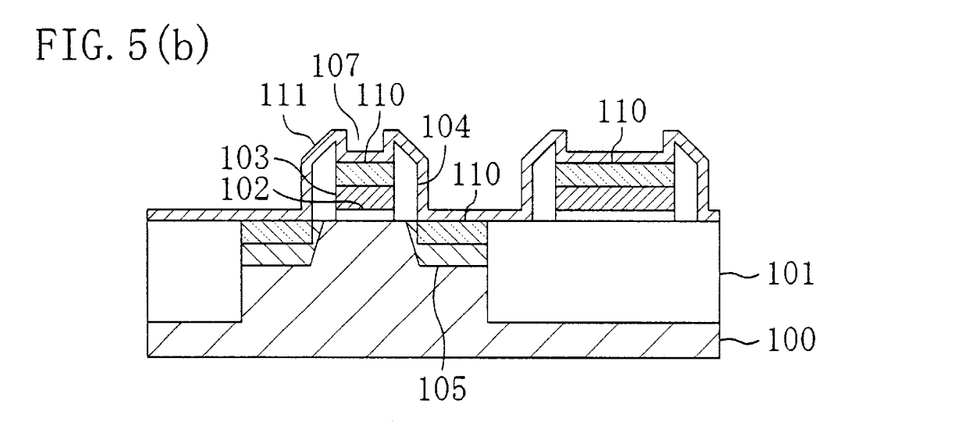

Next, as shown in FIG. 5(b), a silicon film 111 is deposited by PVD or CVD over the entire surface of the silicon substrate. The thickness of the silicon film 111 deposited here will be described later. The deposition of the silicon film 111 is performed at a temperature equal to or lower than the temperature for the first heat treatment. This prevents the CoSi layers 110 from changing to the $CoSi_2$ layer. If the temperature for the first heat treatment is, e.g., 400° C., the $Co_2Si$ layer formed instead of the CoSi layer does not change to the $CoSi_2$ layer.

Figure 5C:
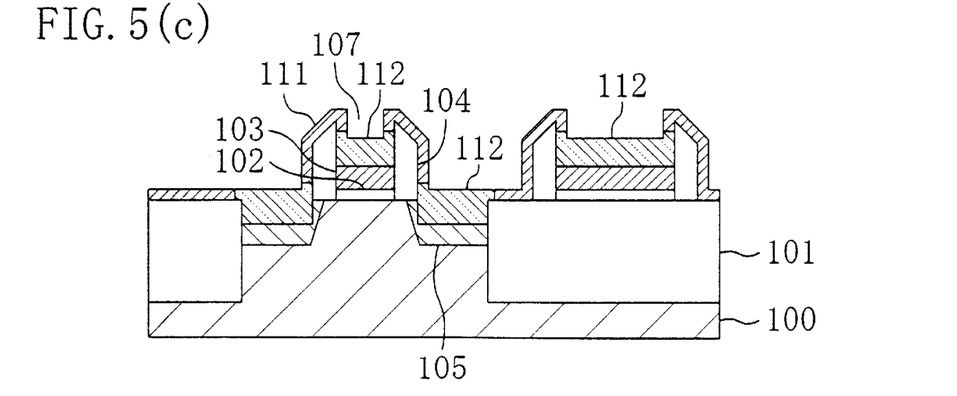

Next, a second heat treatment (RTA) at a high temperature of, e.g., 800° C. is performed with respect to the silicon substrate 100 to cause a reaction between Co atoms in the CoSi layers 110 and Si atoms in the silicon layer 111, whereby a $CoSi_2$ layer 112 is formed in a surface portion of each of the polysilicon film 103 and the impurity diffused layers 105. As a result, the gate electrode composed of the polysilicon film 103 and the $CoSi_2$ layer 112 is formed and the $CoSi_2$ layers 112 each serving as a source or drain electrode is formed in a surface portion of each of the impurity diffused layers 105.

In this case, the Si atoms reacting with the Co atoms in the CoSi layers 110 are supplied from the silicon film 111 and from the polysilicon film 103 (polysilicon film) or the impurity diffused layers 105 (silicon substrate). However, as described in (3) of SUMMARY OF THE INVENTION, the Co atoms in the CoSi layers 110 hardly react with the Si atoms in the polysilicon film 103 or the impurity diffused layers 105 but react preferentially with the Si atoms in the silicon film 111. Accordingly, the vertical position of the interface of the polysilicon film 103 and the vertical position of the top surface of each of the impurity diffused layers 105 hardly move downwardly during the formation of the $CoSi_2$ layers 112.

Since the Co atoms in the CoSi layers 110 react preferentially with the Si atoms in the silicon film 111, the thickness of the silicon film 111 preferably satisfies the relation represented by Thickness of Cobalt Film 108:Thickness of Silicon Film 111=1:1.82, as described in (2) of SUMMARY OF THE INVENTION with reference to FIG. 2(c). In the case where a $Co_2Si$ layer is formed in the surface portion of the polysilicon film 103, the thickness of the silicon film 111 preferably satisfies the relation represented by Thickness of Cobalt Film 108:Thickness of Silicon Film 111=1:2.73, as described in (1) of SUMMARY OF THE INVENTION with reference to FIG. 1(c).

This prevents the number of the Si atoms in the silicon film 111 from becoming excessive or deficient when a reaction occurs between the Si atoms in the silicon film 111 and the Co atoms in the $Co_2Si$ layer or CoSi layer to form the $CoSi_2$ layers 112. As a consequence, the downward movement of the vertical position of the interface of the polysilicon film 103 and the vertical position of the top surface of each of the impurity diffused layers 105 is prevented positively.

In the process of causing a reaction between the Co atoms in the CoSi layers 110 and the Si atoms in the silicon film 111, the surface energy of each of the CoSi layers 110 is lower than in the conventional embodiment since the surface portion of each of the CoSi layers 110 is not exposed during the high-temperature reaction and silicon-rich, as described in (4) of SUMMARY OF THE INVENTION. As a result, agglomeration is less likely to occur at the surface of each of the CoSi layers 110 so that the $CoSi_2$ layers 112 with good uniformity in reaction thickness are obtained.

Figure 6A:
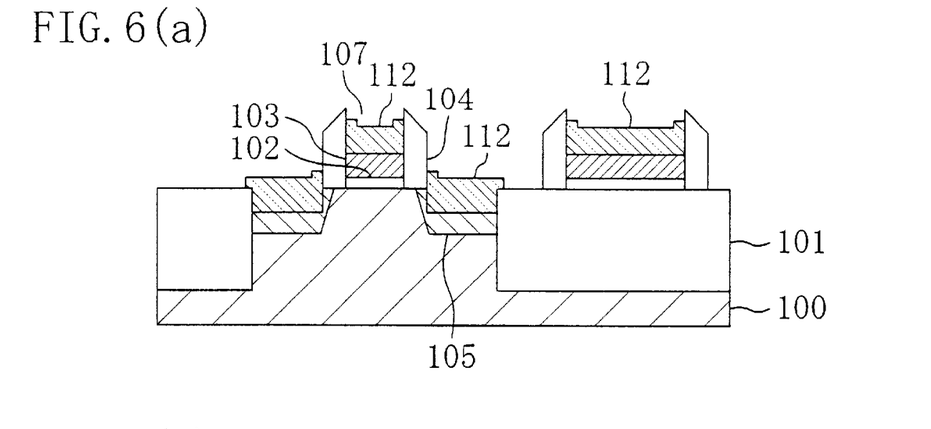
FIGS. 6(a) to (c) are cross-sectional views illustrating the individual process steps of the method for fabricating the semiconductor device according to the first embodiment.
Figure 6B:
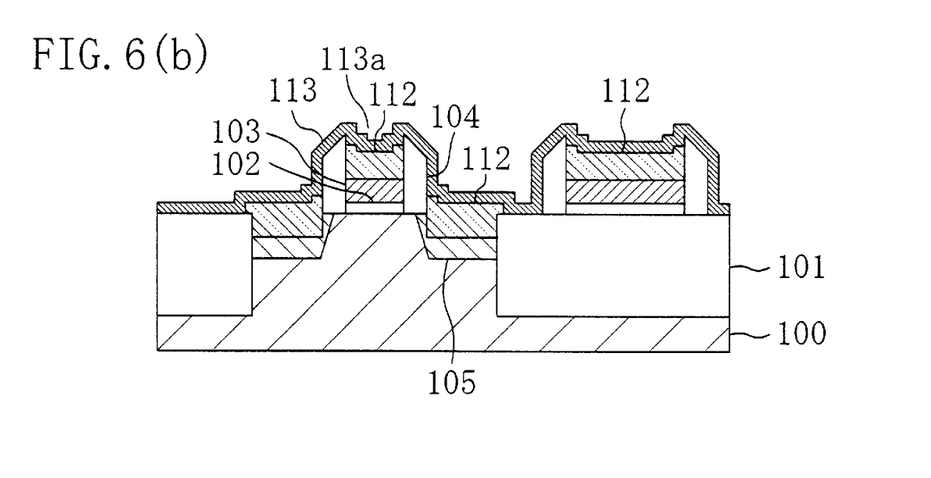

Next, as shown in FIG. 6(a), the portion of the silicon film 111 unreacted with the cobalt film 108 is selectively removed by wet or dry etching. Then, as shown in FIG. 6(b), a liner film 113 composed of, e.g., a SiN film is deposited over the entire surface of the silicon substrate 100. Since the depressed portion 107 is formed internally of the sidewalls 104 and over the polysilicon film 103, the liner film 113 is formed with a depressed portion 113a. That is, the liner film 113 is formed to extend along the upper surface of the $CoSi_2$ layer 112 on the polysilicon film 103, the inner, upper, and outer wall surfaces of the sidewalls 104, and the upper surfaces of the $CoSi_2$ layers 112 in the impurity diffused layers 105.

Figure 6C:
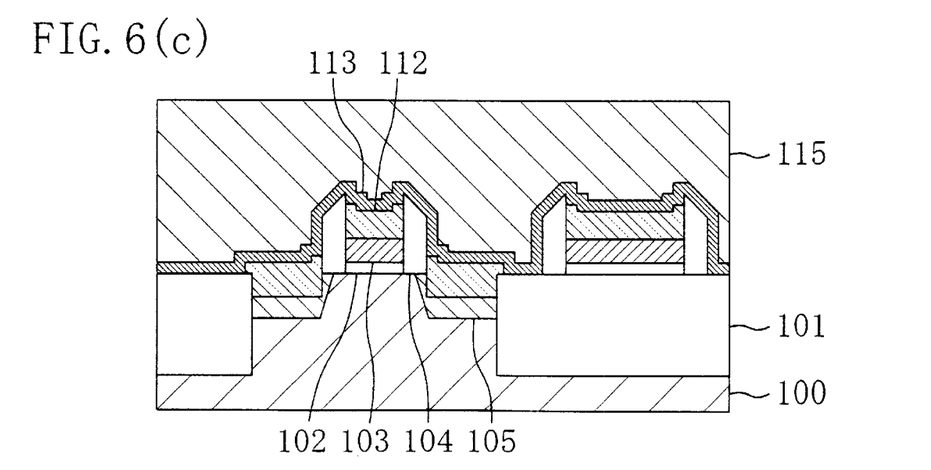
Figure 7A:
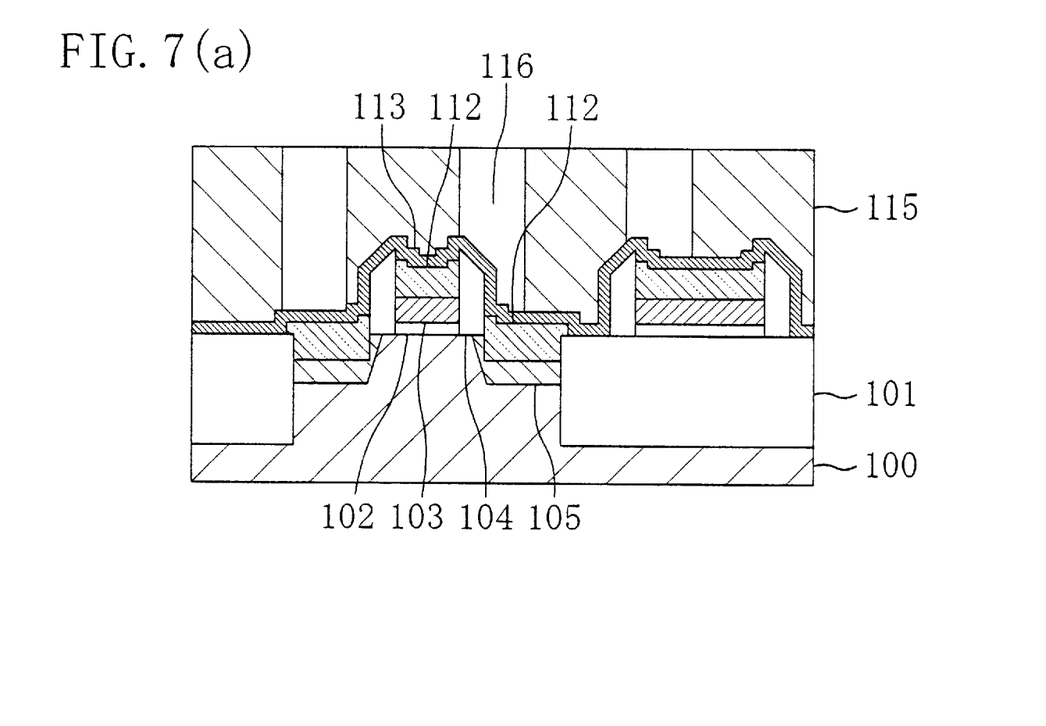
FIGS. 7(a) and (b) are cross-sectional views illustrating the individual process steps of the method for fabricating the semiconductor device according to the first embodiment.

Next, as shown in FIG. 6(c), an interlayer insulating film 115 is deposited over the entire surface of the silicon substrate 100. Thereafter, dry etching is performed with respect to the interlayer insulating film 115 by using a photoresist as a mask, thereby forming contact holes 116 in the interlayer insulating film 115, as shown in FIG. 7(a). In this case, since the liner film 113 has been formed to extend along the inner, upper, and outer wall surfaces of the sidewalls 104, the $CoSi_2$ layer 112 on the polysilicon film 103 is prevented from being exposed in the contact hole 116.

Figure 7B:
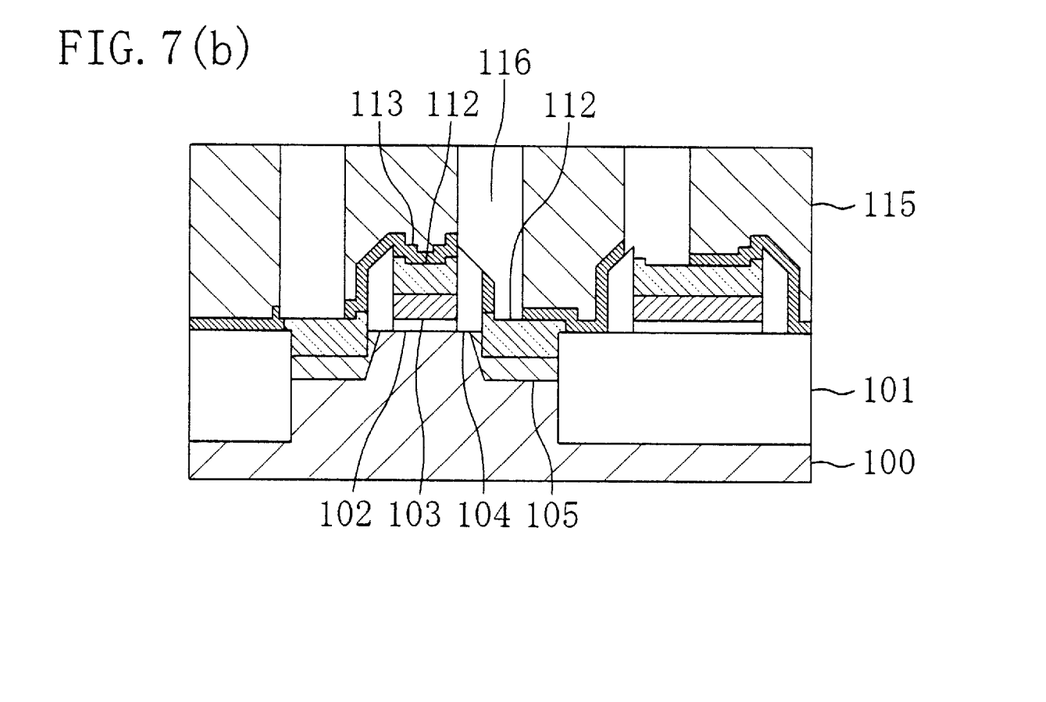

Next, as shown in FIG. 7(b), the portions of the liner film 113 exposed in the contact holes 116 are selectively etched such that the $CoSi_2$ layers 112 in the surface portions of the impurity diffused layers 105 are exposed in the contact holes 116. In this case, since the portions of the liner film 113 extending along the inner wall surfaces of the sidewalls 104 are covered with the interlayer insulating film 115, the $CoSi_2$ layer 112 on the polysilicon film 103 is prevented from being exposed in the contact hole 116, so that an electric connection is not provided between a conductive film buried in the contact hole 116 in the subsequent step and the $CoSi_2$ layer 112 on the polysilicon film 103. As a result, a self-aligned contact can be formed without increasing the number of process steps.

After the silicon film 111 is deposited on the CoSi layer 110, the majority of Co atoms in the CoSi layer 110 react with Si atoms in the silicon film 111 so that the vertical position of the interface of the polysilicon film 103 and the vertical position of the bottom surface of each of the impurity diffused layers 105 hardly move downwardly during the formation of the $CoSi_2$ layer 112.

As a result, there can be formed a MOS transistor having an elevated source/drain structure. This allows formation of the cobalt silicide layer in the surface portion of each of the impurity diffused layers 105 each serving as the source or drain region, which is for circumventing an increase in parasitic resistance, and formation of the impurity diffused layers 105 with shallow pn junctions, which is for preventing a short-channel effect, without increasing a junction leakage current and adding a new process step.

Since $CoSi_2$ is formed in such a manner that CoSi composing the CoSi layer 110 catches and reacts with Si in the silicon film 111, the volume of the $CoSi_2$ layer 112 is larger than the volume of the CoSi layer 110. In other words, the CoSi layer 110 changes to the $CoSi_2$ layer 112, while it expands by taking Si in the silicon film 111. In this case, since the silicon film 111 has been deposited on the CoSi layer 110 and the isolation region 101, the CoSi layer 110 expands upwardly and toward the isolation region 101, so that the area of the upper surface of the $CoSi_2$ layer 112 is larger than the area of the lower surface of the $CoSi_2$ layer 112.

The silicide layer in a conventional elevated source/drain structure is formed by epitaxial growth and the crystal that has been grown epitaxially undergoes faceting since it has grown by succeeding the properties of the underlying crystal structure. Accordingly, the area of the upper surface is smaller than that of the lower surface so that the silicide layer has a generally trapezoidal cross section. If the contact hole is displaced, the problem occurs that the contact area between the silicide layer and the conductive film buried in the contact hole is reduced and therefore the contact resistance is reduced.

However, since the area of the upper surface of the $CoSi_2$ layer 112 is larger than that of the lower surface thereof in the first embodiment, a reduction in the contact area between the $CoSi_2$ layer 112 and the conductive film buried in the contact hole is prevented even if the contact hole connecting to the $CoSi_2$ layer 112 is slightly displaced so that a reduction in contact resistance is circumvented.

Moreover, since the surface energy of the CoSi layer 110 during the second heat treatment is lower than in the conventional embodiment, agglomeration is less likely to occur at the surface of the CoSi layer 110 so that the $CoSi_2$ layer 112 with good uniformity in reaction thickness is obtained.

Although the first embodiment has formed the CoSi layer 110 by depositing the cobalt film 108 and then performing the first heat treatment, it is also possible to form the CoSi layer 110 under conditions for surface treatment which permit the growth of $CoSi_2$. Under such conditions, the silicon film 111 deposited on the CoSi layer 110 suppresses agglomeration at the surface of the CoSi layer 110 so that the $CoSi_2$ layer 112 with a more satisfactory crystal structure is obtained. This further reduces the resistance of the $CoSi_2$ layer 112 formed in the respective surface portions of the polysilicon film 103 and the impurity diffused layers 105. If such surface conditions which permit the formation of epitaxial $CoSi_2$ are applied to the formation of the silicide layers in the source and drain regions according to the present invention, it is also possible to adjust the vertical position of the interface between the $CoSi_2$ layer finally grown and the silicon substrate to be higher than the vertical position of the top surface of the substrate by forming the silicon film 111 sufficiently thick. This achieves a higher-speed operation and lower power consumption.

Although the first embodiment has formed the sidewalls 104 directly on the side surfaces of the polysilicon film 103 composing the gate electrode, it is also possible to provide etching stopper films composed of, e.g., a SiN film between the polysilicon film 103 and the sidewalls 104. In this case, the depressed portion 107 is formed internally of each of the etching stopper films and over the polysilicon film 103, while the liner film 113 is formed to extend along the upper surface of the $CoSi_2$ layer 112 on the polysilicon film 103, the inner wall surfaces of the etching stopper films, the outer wall surfaces of the sidewalls 104, and the upper surfaces of the $CoSi_2$ layers 112 in the impurity diffused layers 105.

Embodiment 2

Figure 8:
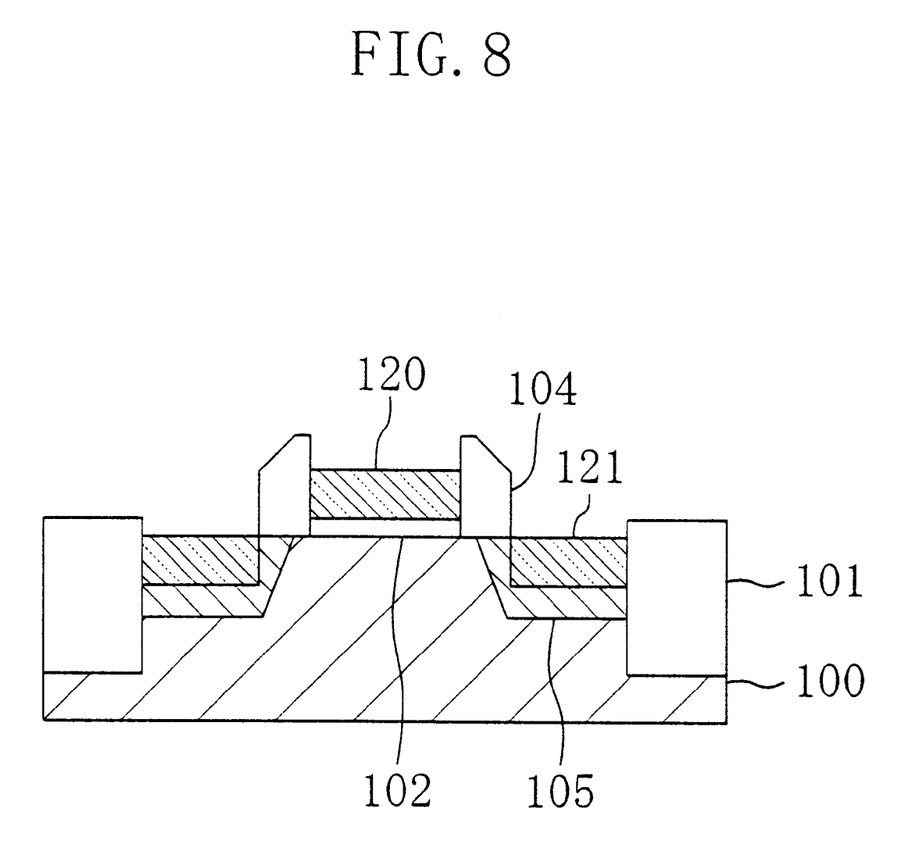
FIG. 8 is a cross-sectional view illustrating a process step of a method for fabricating a semiconductor device according to a second embodiment of the present invention.

A method for fabricating a semiconductor device according to a second embodiment of the present invention will be described with reference to FIG. 8.

First, an isolation region 101 is formed in a surface portion of a silicon substrate 100, similarly to the first embodiment. Then, a polysilicon film composing a gate electrode is formed on the region of the silicon substrate 100 surrounded by the isolation region 101 via a gate insulating film 102 composed of a silicon oxide film. Thereafter, sidewalls 104 are formed on the side surfaces of the polysilicon film and impurity diffused layers 105 each having an LDD structure and serving as a source or drain region are formed.

Next, a surface portion of the polysilicon film composing the gate electrode is selectively etched back. Then, a cobalt film is deposited over the entire surface of the silicon substrate 100. Thereafter, a heat treatment at a high temperature of, e.g., 800° C. is performed to form a gate electrode 120 composed of a $CoSi_2$ layer and a $CoSi_2$ layer 121 in a surface portion of each of the impurity diffused layers 105, as shown in FIG. 8.

The second embodiment is characterized in that the gate electrode 120 composed of the $CoSi_2$ layer is formed by causing a reaction between Co atoms in the cobalt film and Si atoms in the polysilicon film without an excess or deficiency of Si and Co atoms. This minimizes the wiring resistance of the gate electrode 120.

Since the gate electrode 120 is composed of the cobalt silicide formed by causing a reaction between the polysilicon film and the cobalt film deposited on the polysilicon film without an excess or deficiency of Si and Co atoms, an atomic arrangement at the surface of the gate electrode 120 in contact with the gate insulating film 102 is similar to an atomic arrangement at the stable $Si/SiO_2$ interface so that it contributes to the formation of a stable metal gate structure. Since the Fermi level in $CoSi_2$ is located adjacent to the center of the band gap of Si, a MOSFET having a high threshold voltage can be formed integrally in a single substrate.

Although the second embodiment has formed the gate electrode 120 composed of the $CoSi_2$ layer by depositing the cobalt film over the entire surface of the silicon substrate 100 and then performing a high-temperature heat treatment, it is also possible to perform a two-step heat treatment instead. Specifically, the cobalt film is deposited over the entire surface of the silicon substrate 100 and then a first heat treatment at a low temperature is performed to cause a reaction between Co atoms in the cobalt film and Si atoms in the polysilicon film, whereby the $Co_2Si$ layer or CoSi layer is formed. Then, a silicon film is deposited on the $Co_2Si$ layer or CoSi layer and then a second heat treatment at a high temperature is performed to cause a reaction between Co atoms in the $Co_2Si$ layer or CoSi layer and Si atoms in the silicon film without an excess or deficiency of Si and Co atoms, whereby the gate electrode 120 composed of the $Co_2Si$ layer is formed properly.

By performing the two-step heat treatment, the surface portion of the $Co_2Si$ layer or CoSi layer is prevented from being exposed during the high-temperature reaction and is therefore silicon-rich so that the surface energy of the $Co_2Si$ layer or CoSi layer is lower than in the conventional embodiment. As a result, agglomeration is less likely to occur at the surface of the $Co_2Si$ layer or CoSi layer so that a gate electrode composed of the $CoSi_2$ layer with good uniformity in reaction thickness is formed.

What is claimed is:

1. A method for fabricating a semiconductor device, the method comprising the steps of:

forming, on a silicon substrate, a patterned polysilicon film composing a gate electrode and forming, in surface portions of the silicon substrate located on both sides of the polysilicon film, impurity diffused layers each serving as a source or drain region, while forming sidewalls composed of a first insulting film on side surfaces of the polysilicon film on the silicon substrate;

removing a surface portion of the polysilicon film to form a depressed portion over the polysilicon film and internally of the sidewalls;

forming a cobalt silicide layer in a surface portion of each of the polysilicon film and the impurity diffused layers;

forming a liner film composed of a second insulating film such that the liner film extends along an upper surface of the cobalt silicide layers on the polysilicon film, inner and outer wall surfaces of the sidewalls, and an upper surface of the cobalt silicide layer in each of the impurity diffused layers;

depositing in interlayer insulating film on the liner film; and performing selective etching with respect to the interlayer insulating film and the liner film to form a contact hole for exposing therein the cobalt silicide layer in each of the impurity diffused layers.

2. The method of claim 1, wherein each of the impurity diffused layers has an LDD structure formed by ion implanting an impurity at a low concentration by using the polysilicon as a mask and then ion implanting an impurity at a high concentration by using the polysilicon film and the sidewalls as a mask.

3. The method of claim 1, wherein the step of forming the cobalt silicide layer includes the steps of:

depositing a cobalt film over the polysilicon film and the impurity diffused layers;

performing a first heat treatment at a relatively low temperature with respect to the silicon substrate to cause a reaction between the cobalt film and each of the polysilicon film and the impurity diffused layers and thereby form a $Co_2Si$ layer or CoSi layer in a surface portion of each of the polysilicon film and the impurity diffused layers;

depositing a silicon-containing film on the $Co_2Si$ layer or CoSi layer; and performing a second heat treatment at a relatively high temperature with respect to the silicon substrate to cause a reaction between the silicon-containing film and the $Co_2Si$ layer or CoSi layer and thereby form a $CoSi_2$ layer in a surface portion of each of the polysilicon film and the impurity diffused layers.

* * * * *